(12) United States Patent
Li et al.

(10) Patent No.: US 10,205,018 B1
(45) Date of Patent: Feb. 12, 2019

(54) PLANAR DOUBLE GATE SEMICONDUCTOR DEVICE

(71) Applicant: QUALCOMM Incorporated, San Diego, CA (US)

(72) Inventors: Xia Li, San Diego, CA (US); Bin Yang, San Diego, CA (US); Gengming Tao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/676,494

(22) Filed: Aug. 14, 2017

(51) Int. Cl.
| | | |
|---|---|---|
| *H01L 29/78* | (2006.01) | |
| *H01L 29/66* | (2006.01) | |
| *H01L 29/16* | (2006.01) | |
| *H01L 27/092* | (2006.01) | |
| *H01L 21/8238* | (2006.01) | |

(52) U.S. Cl.
CPC ...... *H01L 29/7831* (2013.01); *H01L 21/8238* (2013.01); *H01L 27/092* (2013.01); *H01L 29/1606* (2013.01); *H01L 29/6656* (2013.01); *H01L 29/66484* (2013.01)

(58) Field of Classification Search
CPC ............. H01L 29/7831; H01L 21/8238; H01L 27/092; H01L 29/66484; H01L 29/6656; H01L 29/1606
See application file for complete search history.

(56) References Cited

U.S. PATENT DOCUMENTS

| | | | | |
|---|---|---|---|---|
| 5,324,980 A | * | 6/1994 | Kusunoki | ........... H01L 27/0688 257/723 |
| 5,923,963 A | * | 7/1999 | Yamanaka | ............ G02F 1/1362 438/157 |
| 6,143,582 A | * | 11/2000 | Vu | ......................... A61B 3/113 438/30 |
| 6,639,246 B2 | * | 10/2003 | Honda | ................ H01L 29/6675 257/347 |
| 6,982,460 B1 | * | 1/2006 | Cohen | ............... H01L 29/66772 257/328 |
| 7,074,623 B2 | | 7/2006 | Lochtefeld et al. | |
| 7,101,762 B2 | | 9/2006 | Cohen et al. | |
| 7,361,944 B2 | * | 4/2008 | Kawai | ................. H01L 21/6835 257/192 |
| 7,572,687 B2 | * | 8/2009 | Jung | ................. H01L 29/78648 257/330 |
| 7,799,657 B2 | | 9/2010 | Dao et al. | |
| 8,530,972 B2 | | 9/2013 | John et al. | |

(Continued)

*Primary Examiner* — William Coleman
(74) *Attorney, Agent, or Firm* — Patterson & Sheridan, LLP

(57) ABSTRACT

Certain aspects of the present disclosure generally relate to a semiconductor device. The semiconductor device generally includes a substrate, a channel disposed above the substrate, and a first dielectric layer disposed adjacent to a first side of the channel. The semiconductor device may also include a first non-insulative region disposed between the first dielectric layer and the substrate, and a second dielectric layer disposed adjacent to a second side of the channel, wherein the first dielectric layer and the second dielectric layer comprise high-k layers. In certain aspects, a second non-insulative region may be disposed above the second dielectric layer, and a third non-insulative region may be disposed adjacent to a third side of the channel.

28 Claims, 10 Drawing Sheets

(56) References Cited

U.S. PATENT DOCUMENTS

| | | | |
|---|---|---|---|
| 8,575,699 B2* | 11/2013 | Chan | H01L 21/7624 |
| | | | 257/347 |
| 9,390,974 B2* | 7/2016 | Stuber | H01L 21/6835 |
| 2006/0035442 A1 | 2/2006 | Ilicali et al. | |
| 2016/0111369 A1* | 4/2016 | Or-Bach | H01L 23/5286 |
| | | | 257/757 |
| 2016/0155839 A1* | 6/2016 | Strachan | H01L 29/42324 |
| | | | 257/29 |
| 2017/0110678 A1* | 4/2017 | Zang | H01L 51/0554 |

\* cited by examiner

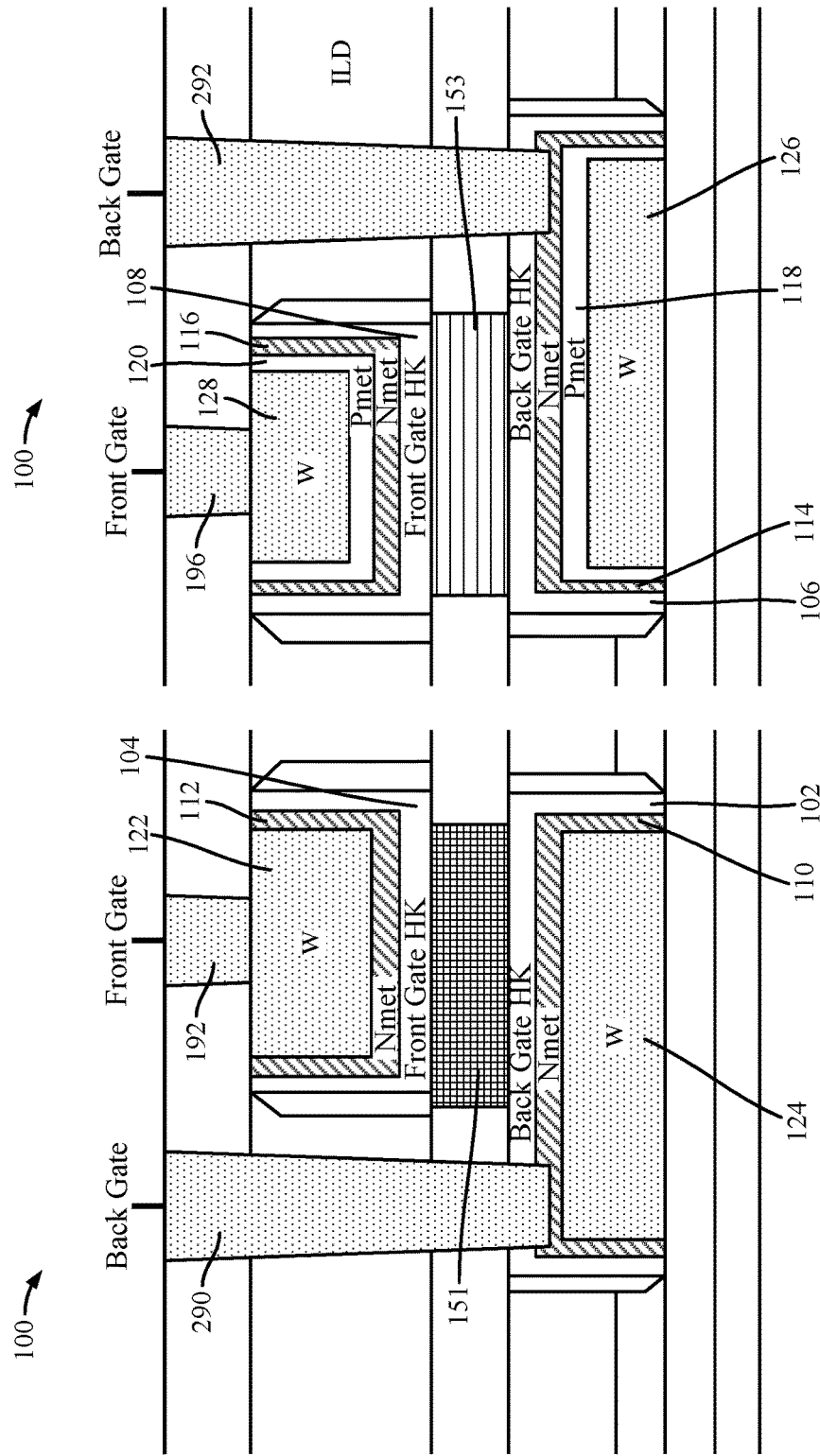

US 10,205,018 B1

PLANAR DOUBLE GATE SEMICONDUCTOR DEVICE

TECHNICAL FIELD

Certain aspects of the present disclosure generally relate to semiconductor devices and, more particularly, to a double-gate semiconductor device.

BACKGROUND

A fully-depleted silicon on insulator (FD-SOI) process is a planar process technology to fabricate a transistor having a thin layer of insulator (e.g., buried oxide) and a thin silicon film for the transistor channel. The depletion region of a FD-SOI transistor may cover the whole channel such that the channel is fully depleted. FD-SOI improves the transistor electrostatic characteristics as compared to conventional bulk technology and lowers the parasitic capacitance between the source and the drain. The thin channel also confines the electron flow from the source to the drain, reducing leakage currents.

SUMMARY

Certain aspects of the present disclosure generally relate to a semiconductor device and techniques for fabricating the same.

Certain aspects of the present disclosure provide a semiconductor device. The semiconductor device generally includes a substrate, a channel disposed above the substrate, and a first dielectric layer disposed adjacent to a first side of the channel. The semiconductor device may also include a first non-insulative region disposed between the first dielectric layer and the substrate, and a second dielectric layer disposed adjacent to a second side of the channel, wherein the first dielectric layer and the second dielectric layer comprise high-k layers. In certain aspects, a second non-insulative region may be disposed above the second dielectric layer, and a third non-insulative region may be disposed adjacent to a third side of the channel.

Certain aspects of the present disclosure provide a semiconductor device. The semiconductor device generally includes a substrate, a channel disposed above the substrate, a first dielectric layer disposed adjacent to a first side of the channel, a first non-insulative region disposed between the first dielectric layer and the substrate, a second dielectric layer disposed adjacent to a second side of the channel, a second non-insulative region disposed above the second dielectric layer, and a third non-insulative region disposed adjacent to a third side of the channel. The semiconductor device also includes a fourth non-insulative region and a fifth non-insulative region disposed adjacent to the third non-insulative region and having a lower doping concentration than the third non-insulative region, wherein a portion of the channel is disposed between the fourth non-insulative region and the fifth non-insulative region.

Certain aspects of the present disclosure provide a semiconductor device. The semiconductor device generally includes a substrate, a channel disposed above the substrate, a first dielectric layer disposed adjacent to a first side of the channel, a first non-insulative region disposed between the first dielectric layer and the substrate, a second dielectric layer disposed adjacent to a second side of the channel, a second non-insulative region disposed above the second dielectric layer, and a third non-insulative region disposed adjacent to a third side of the channel. The semiconductor device also includes a first silicide layer disposed above the third non-insulative region, and a second silicide layer disposed below the third non-insulative region.

Certain aspects of the present disclosure provide a method for fabricating a semiconductor device. The method generally includes forming a channel on a graphene layer, removing the channel from the graphene layer, disposing the channel on a first dielectric layer such that the first dielectric layer is disposed adjacent to a first side of the channel, forming a first non-insulative region adjacent to a second side of the channel, removing the first dielectric layer disposed adjacent to the first side of the channel, and forming a second non-insulative region adjacent to the first side of the channel.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Certain aspects of the present disclosure are generally directed to a planar dual-gate semiconductor device and techniques for fabricating the same using a graphene layer. Certain aspects of the present disclosure provide a less complex process for fabricating a dual-gate semiconductor device as compared to conventional processes. For example, a graphene layer may be used to form a semiconductor channel on an oxide layer for the dual-gate semiconductor device. Moreover, surface oxide hydrophilic pre-treatment of a handle wafer may be used to enable de-bonding of the semiconductor channel for back-gate formation.

A thick buried oxide (BOX) for the back gate of a dual-gate semiconductor device may result in less back-gate control and higher back-gate voltage (e.g., 1 to 2 V), resulting in increased power consumption by the semiconductor device. Certain aspects of the present disclosure allow for a thicker semiconductor channel and thinner back-gate dielectric layer, reducing the bias voltage used to control the back gate, and as a result, lowering the power consumption of the semiconductor device.

Figure 1:
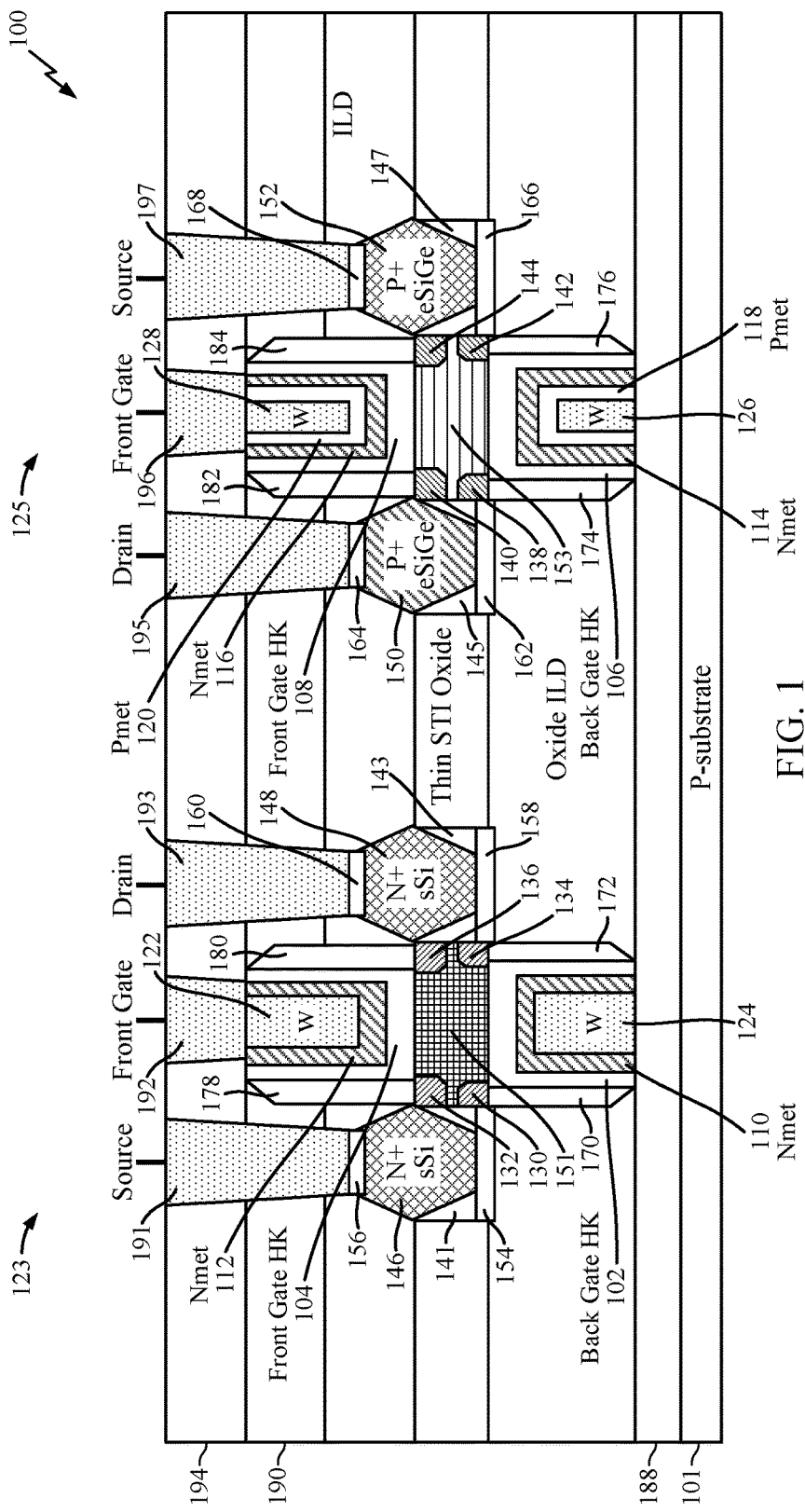
FIG. 1 illustrates a cross-section of an example semiconductor device, in accordance with certain aspects of the present disclosure.

FIG. 1 illustrates an example semiconductor device 100, in accordance with certain aspects of the present disclosure. The semiconductor device 100 includes an example planar double-gate n-channel metal-oxide semiconductor (NMOS) device 123 and an example planar double-gate p-channel metal-oxide semiconductor (PMOS) device 125, fabricated on a substrate 101 (e.g., a p-type substrate (labeled "P-substrate" in FIG. 1)). For example, the semiconductor device 100 may be a complementary metal-oxide semiconductor (CMOS) device used for CMOS logic.

The NMOS device 123 and the PMOS device 125 each include front and back gate regions (e.g., that are electrically isolated), where a front gate region generally refers to a gate region above a channel and a back gate region generally refers to a gate region below the channel. In certain aspects, the front and back gate regions may be implemented using high-k/metal gate (HK/MG) technology. For example, the front gate region of the NMOS device 123 may include high-k (HK) dielectric region 104, n-type metal (Nmet) gate region 112, and contact region 122. The back gate region of the NMOS device 123 may include HK dielectric region 102, Nmet gate region 110, and contact region 124. The front gate region of the PMOS device 125 may include HK dielectric region 108, Nmet gate region 116, p-type metal (Pmet) gate region 120, and contact region 128. The back gate region of the PMOS device 125 may include HK dielectric region 106, Nmet gate region 114, Pmet gate region 118, and contact region 126. Moreover, spacers 170, 172, 174, 176, 178, 180, 182, and 184 may be formed adjacent to the front or back gate regions, as illustrated. A trench formed in each of the metal gate regions 110, 112, 118, and 120 may be filled with any of various suitable electrically conductive materials, such as tungsten (W), to form the contact regions 122, 124, 126, and 128, as illustrated.

In certain aspects, NMOS device 123 and PMOS device 125 may include lightly doped regions 130, 132, 134, 136, 138, 140, 142, and 144 formed in respective NMOS and PMOS channels 151 and 153. A lightly doped region (e.g., expressed as n– or p–) may refer to a region having a doping concentration that is lower than the doping concentration of a heavily doped region (e.g., expressed as n+ or p+). As illustrated, a separate lightly doped region may be included adjacent to each of the front and back gate regions, as well as adjacent to the source and drain (S/D) regions (e.g., non-insulative regions). In certain aspects, the S/D regions of the NMOS device 123 may include N+ non-insulative regions 146 and 148 (e.g., formed adjacent to different lateral surfaces of the NMOS channel 151), and the S/D regions of the PMOS device 125 may include P+ non-insulative regions 150 and 152 (e.g., formed adjacent to different lateral surfaces of the PMOS channel 153). In certain aspects, silicide layers 154, 158, 162, and 166 may be disposed below the S/D regions, and silicide layers 156, 160, 164, and 168 may be disposed above the S/D regions, as illustrated.

Figure 2A:
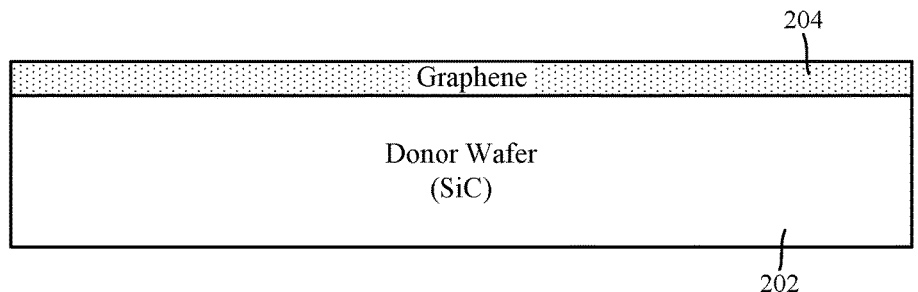
FIGS. 2A-2V illustrate a process for fabricating the semiconductor device of FIG. 1, in accordance with certain aspects of the present disclosure.
Figure 2B:
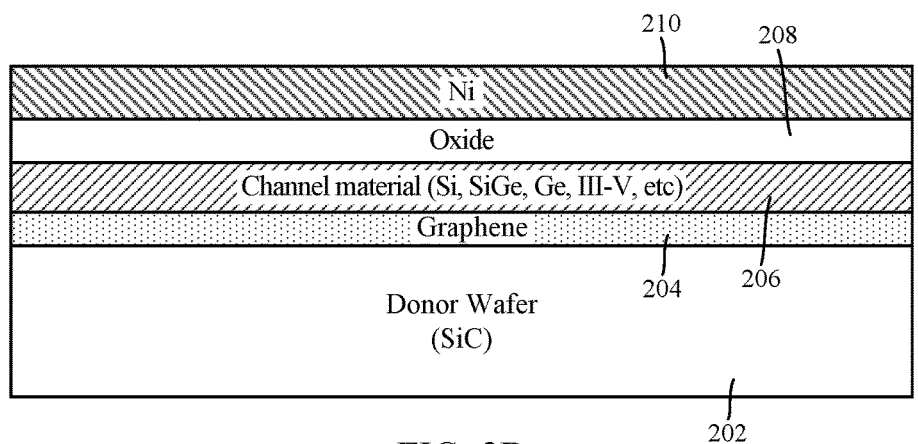
Figure 2C:
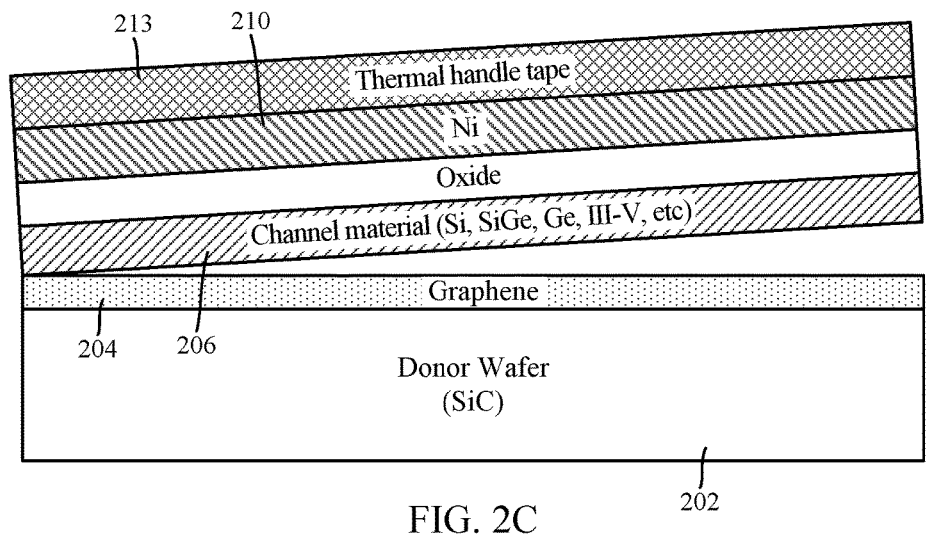
Figure 2D:
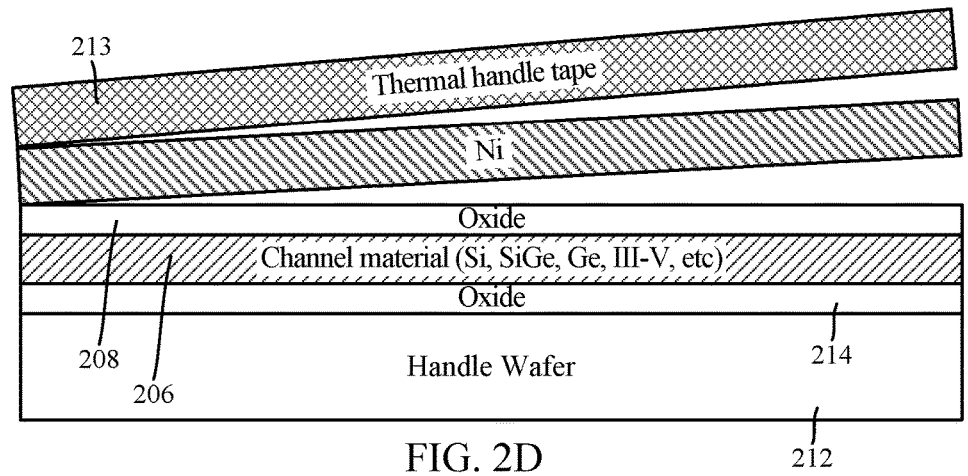
Figure 2E:
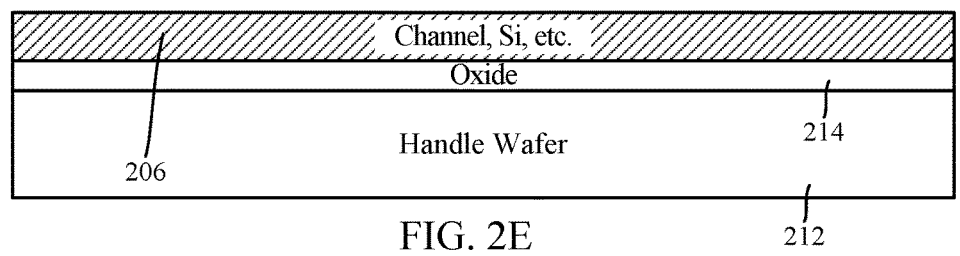
Figure 2F:
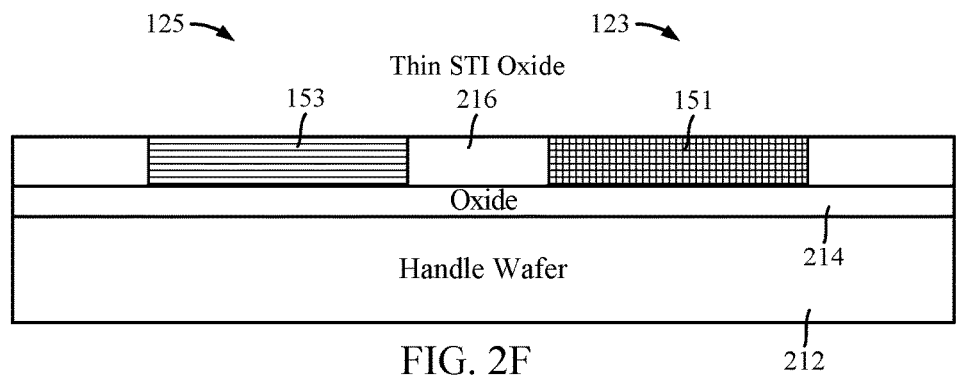
Figure 2G:
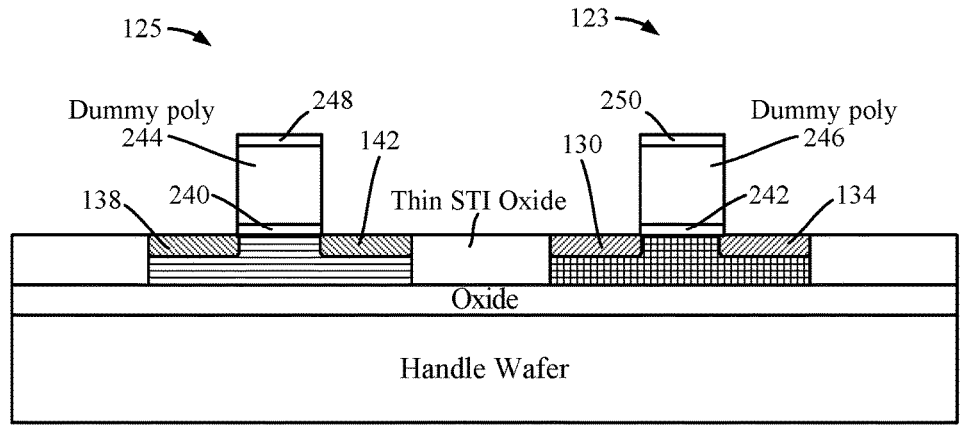
Figure 2H:
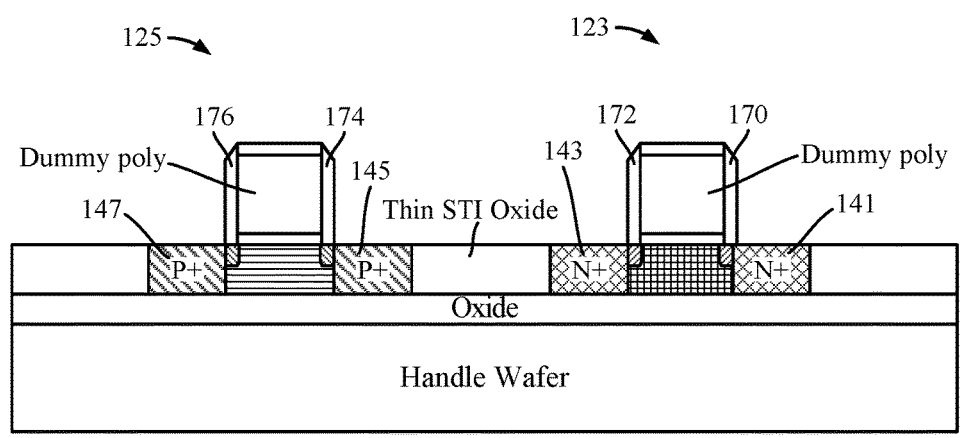
Figure 2I:
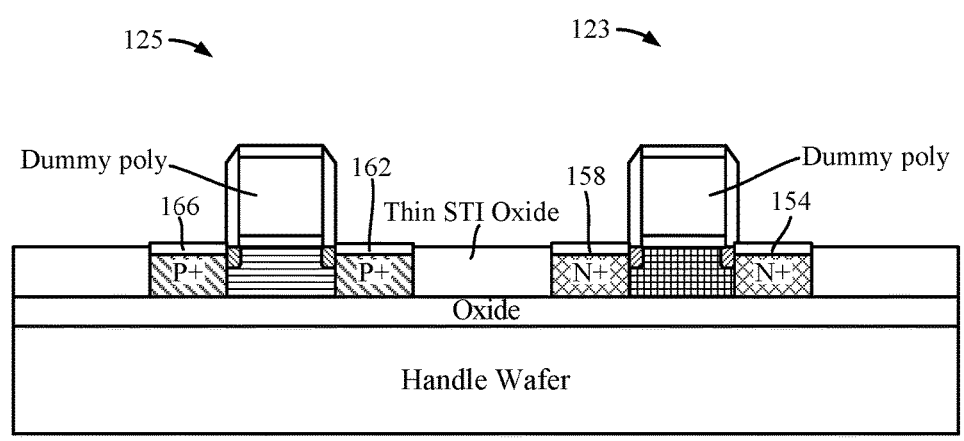
Figure 2J:
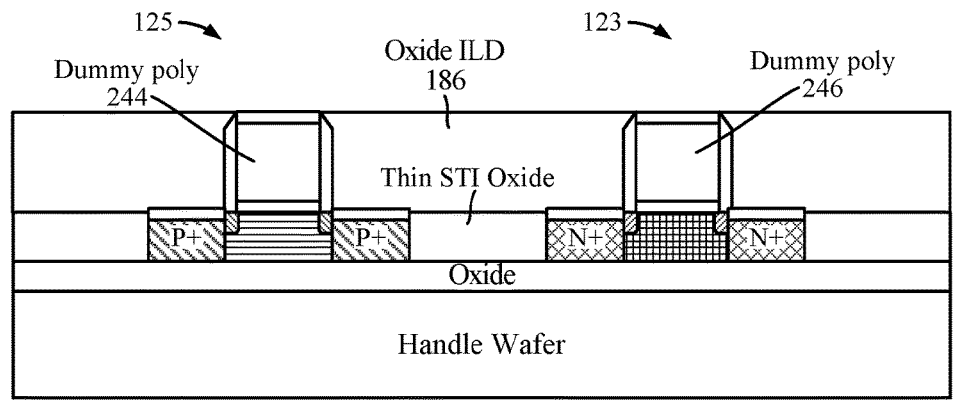
Figure 2K:
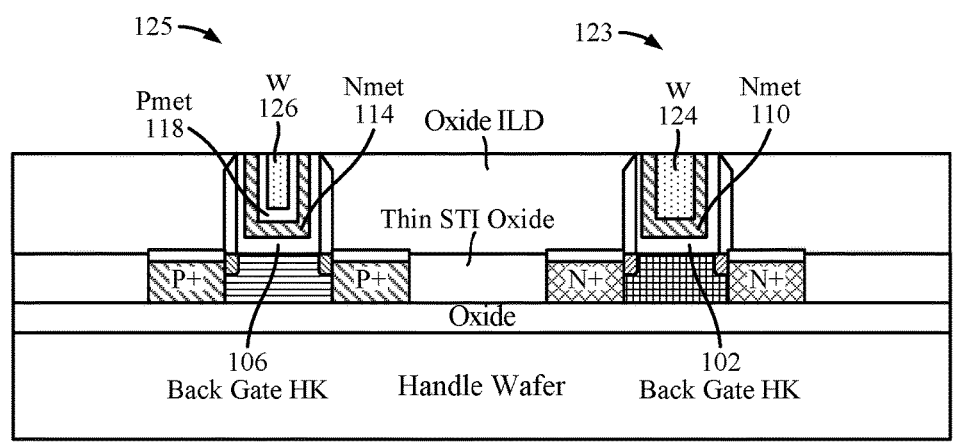
Figure 2L:
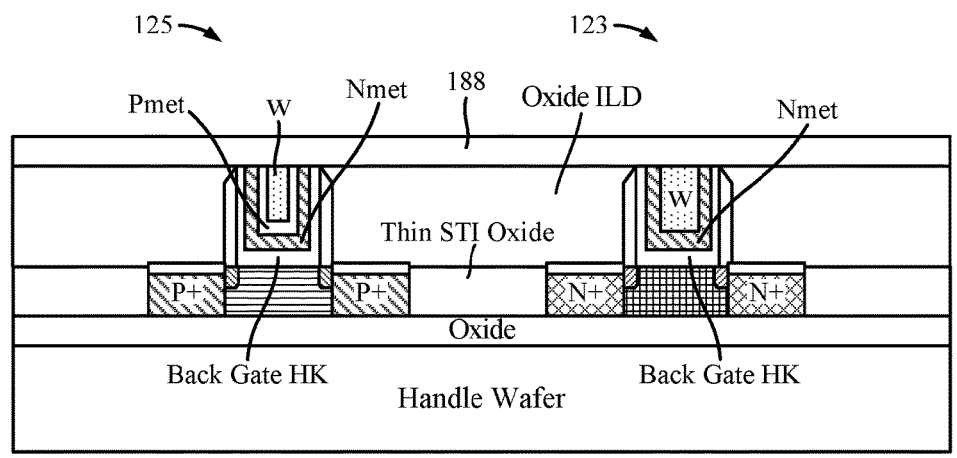
Figure 2M:
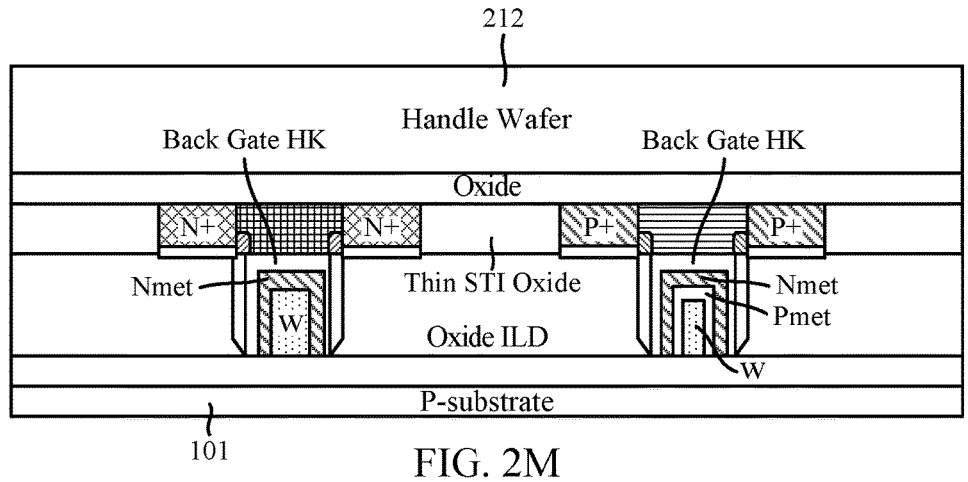
Figure 2N:
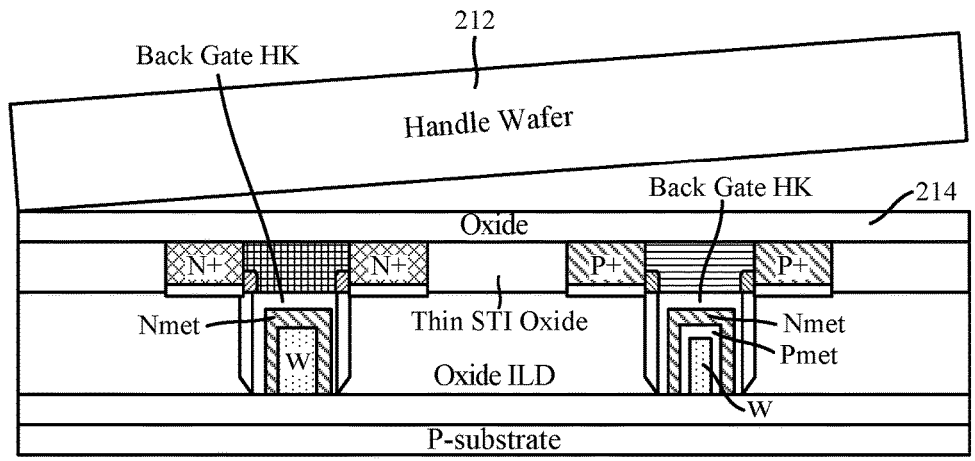
Figure 2O:
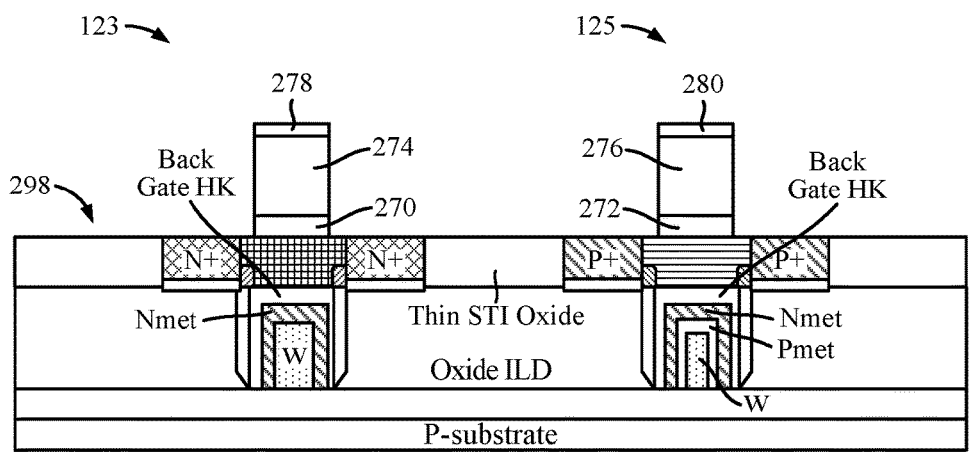
Figure 2P:
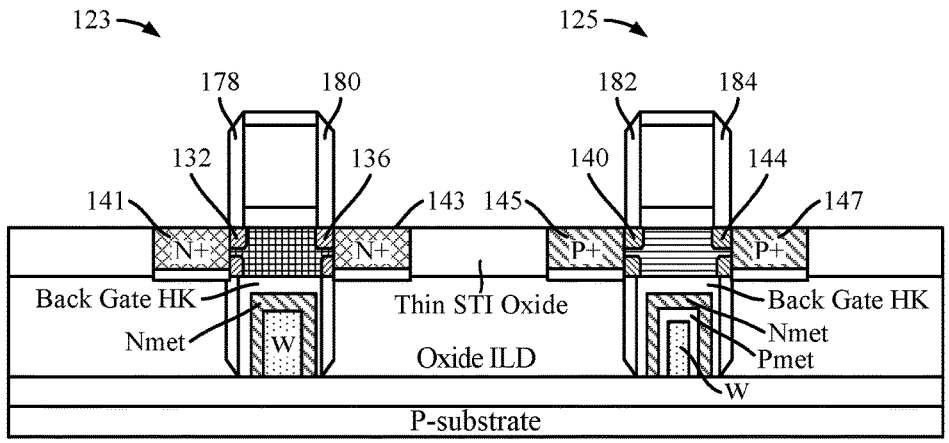
Figure 2Q:
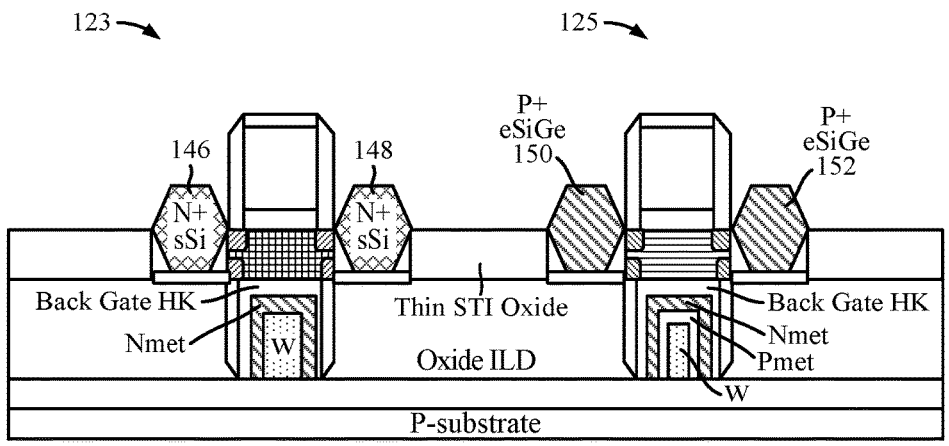
Figure 2R:
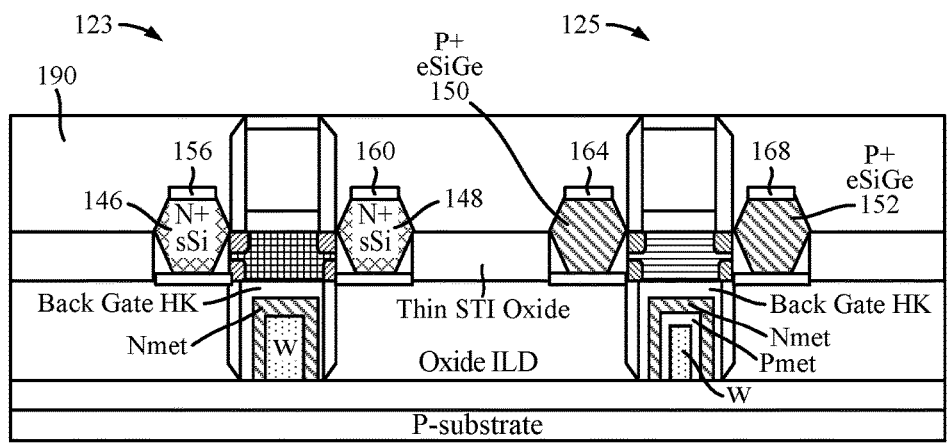
Figure 2S:
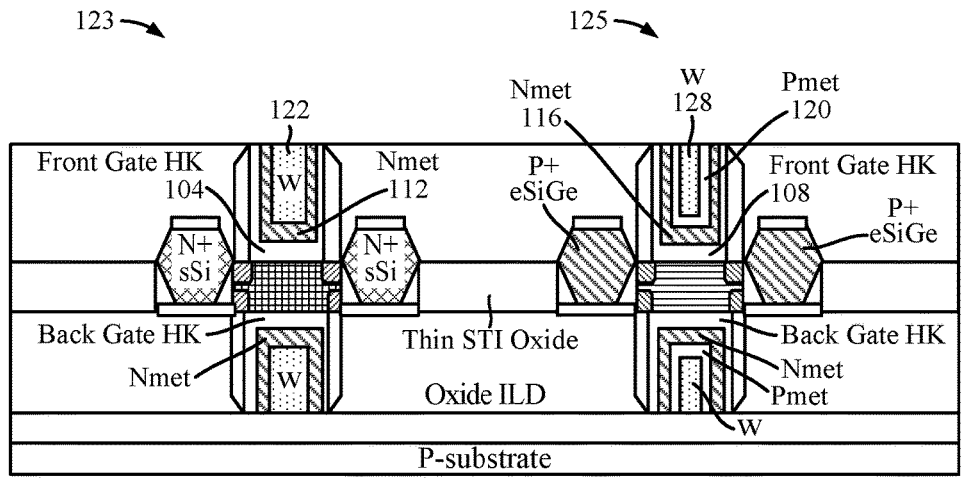
Figure 2T:
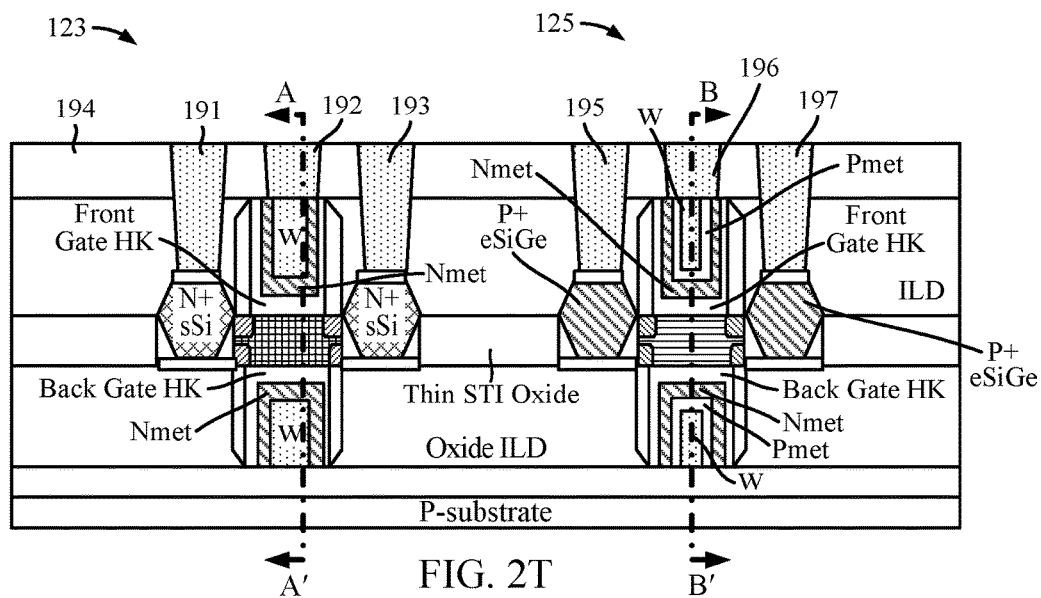

FIGS. 2A-2T illustrate an example process for fabricating the semiconductor device 100, in accordance with certain aspects of the present disclosure. In certain aspects, the example process for fabricating the semiconductor device may be implemented using a graphene-based layer transfer process. For example, as illustrated in FIG. 2A, a graphene layer 204 may be formed on a donor wafer 202 (e.g., using a graphitization process at 1200 to 1400° C.), or the graphene layer 204 may be transferred onto the donor wafer 202. The graphene layer 204 may be a thin 2D layer of carbon atoms that may be bonded together to form a hexagonal lattice (i.e., a honeycomb lattice). The donor wafer 202 may comprise any suitable material for accepting graphene, such as silicon carbide (SiC).

The graphene layer 204 allows for the formation of an epitaxial layer ("epi-layer") on the graphene that can be subsequently removed and placed on a host wafer. For example, as illustrated in FIG. 2B, a channel 206 is formed on the graphene layer 204 (e.g., using a Van der Waals epitaxy semiconductor single crystal channel material layer on graphene). The channel 206 may be implemented using silicon (Si), silicon germanium (SiGe), germanium (Ge), or any material corresponding to type III-V process technology. An oxide layer 208 may be formed on the channel 206 to serve as a protection layer, as well as a Nickel (Ni) stressor metal layer 210. As illustrated in FIG. 2C, a thermal handle tape 213 may be deposited on top of the Ni stressor metal layer 210, such that the channel 206 can be mechanically exfoliated from the graphene layer 204 using the handle tape.

As illustrated in FIG. 2D, an oxide layer 214 may be formed on a surface of a handle wafer 212 after surface oxide pretreatment of the handle wafer 212. After mechanically exfoliating the channel 206 from the graphene layer, the channel 206 may be disposed on the oxide layer 214. Thermal de-tape (e.g., at a temperature of about 90° C.) is used to release the thermal handle tape 213. Using a ferric chloride ($FeCl_3$)-based solution, the Ni stressor metal layer 210 may be removed, followed by wet etching and wafer cleaning. In certain aspects, an annealing process at a temperature of about 500° C. to 800° C. may be used to enhance the silicon-hydroxide-silicon oxide (Si—OH—SiOx) bonds of the handle wafer oxide surface. After this, the oxide layer 208 is removed by wet etching, and the surface of the channel 206 is cleaned, as illustrated in FIG. 2E.

As illustrated in FIG. 2F, a shallow trench isolation (STI) mask and photoresist (PR)/etch process is used to open a trench in the channel 206. The PR is then removed, the surface is cleaned, oxide is deposited in the trench to form the thin STI oxide region 216, and chemical-mechanical polishing (CMP) is performed close to the silicon surface. In certain aspects, the process to form the STI may be performed after the formation of the back gate and channel bonding on final substrate wafer. NMOS and/or PMOS masks and PR may be used to dope the channel 206 to form an NMOS channel 151 and/or a PMOS channel 153. In certain aspects, the NMOS channel 151 and/or the PMOS channel 153 may be doped with an n-type threshold implant region (NVt) and/or a p-type threshold implant region (PVt). In some cases, the silicon surface of the channel 206, in which the NMOS channel 151, the PMOS channel 153, and the thin STI oxide region 216 are formed, may be dipped to open the silicon surface.

In certain aspects, gate oxides 240 and 242, dummy poly regions 244 and 246 (e.g., poly-silicon), and oxide hard mask regions 248 and 250 may be deposited and patterned, as illustrated in FIG. 2G. The dummy poly regions 244 and 246 are used as placeholders to form spacers, as shown in FIG. 2H, and are subsequently removed. A gate mask and photo-etching process may be used to pattern the dummy poly regions 244 and 246 to form gates. N-type lightly doped drain (NLDD) and p-type lightly doped drain (PLDD) masks/photo patterning and NLDD/pocket and PLDD/pocket implant processes may be used to separately form the n-type lightly doped regions 138 and 142 and p-type lightly doped regions 130 and 134, respectively.

As illustrated in FIG. 2H, dielectric material (e.g., silicon nitride (SiN)) is then deposited. The dielectric material is then etched back towards the lateral surfaces of the dummy poly regions 244 and 246 to form the spacers 170, 172, 174, and 176. Using N+ or P+S/D masks/photo patterning and N+ or P+ implant, the S/D non-insulative regions 141, 143, 145, and 147 may be formed separately. A high temperature annealing process can be used to activate the dopant used to form the S/D non-insulative regions 141, 143, 145, and 147.

As illustrated in FIG. 2I, silicide layers 154, 158, 162, and 166 may be formed on the P+ and N+S/D non-insulative regions 141, 143, 145, and 147. Interlayer dielectric (ILD) oxide 186 is then deposited between the dummy poly regions 244 and 246, as illustrated in FIG. 2J. The oxide hard mask regions 248 and 250 may be removed from the dummy poly regions 244 and 246, respectively, using any of various suitable processes, such as CMP.

As illustrated in FIG. 2K, the dummy poly regions 244 and 246 may be removed by any of various suitable processes, such as a wet etching process, to form gate trenches. The back-gate HK material, Nmet material (e.g., titanium aluminum nitride (TiAlN)) and Pmet material (e.g., tantalum nitride (TaN)) and titanium aluminum nitride (TiAlN) are then deposited in the gate trenches. Using an NMOS mask and PR to open the NMOS area, the Pmet material (e.g., tantalum nitride (TaN)) is removed via an etching process for the NMOS device 123, and the PR is subsequently removed. An electrically conductive material (e.g., W) is then deposited into the gate trenches, followed by CMP of the metal gate to remove extra film, forming the back gate regions using HK/MG technology for the NMOS and PMOS devices 123 and 125.

As illustrated in FIG. 2L, ILD oxide 188 is then deposited, and the surface of the ILD oxide 188 is made flat, using any of various suitable processes, such as CMP. As illustrated in FIG. 2M, the handle wafer 212 is used to invert (i.e., flip) the intermediate structure at this stage, and the substrate 101 is directly bonded to the ILD oxide 188. An annealing process (e.g., at 500-600° C.) may be used to enhance surface silicon oxide-silicon (SiO—Si) bond strength.

As illustrated in FIG. 2N, the hydrophilic pre-treated surface of the handle wafer 212 is then debonded from the remainder of the intermediate structure. Due to the hydrophilic pre-treatment, the handle wafer 212 can be debonded from the rest of the intermediate structure even after an annealing temperature treatment at 1100° C. As illustrated in FIG. 2O, the oxide layer 214 is then removed, and the top surface 298 of the intermediate structure at this stage is cleaned to deposit and form the gate oxides 270 and 272, dummy poly regions 274 and 276, and oxide hard mask regions 278 and 280. For example, dummy poly photo-etching is used to pattern the front gate.

As illustrated in FIG. 2P, NLDD/pocket and PLDD/pocket PR and implant process is used to separately form the n-type lightly doped regions 132 and 136, and p-type lightly doped regions 140 and 144. Dielectric material (e.g., SiN film) is then deposited and etched back towards the lateral surfaces of the dummy poly regions 274 and 276 to form spacers 178, 180, 182, and 184. A PR and etching process is used to recess the silicon on the N+S/D non-insulative regions 141 and 143, followed by an epitaxial process to form the N+ strained silicon (sSi) or embedded silicon carbide (eSiC) to form the N+S/D non-insulative regions 146 and 148. A thin oxide layer or SiN film is then deposited to protect the N+ epitaxial growth, before forming the P+S/D non-insulative regions 150 and 152. For example, photo-etching process is used to recess the silicon on the P+S/D non-insulative regions 145 and 147, followed by an epitaxial process to form the P+ embedded silicon germanium (eSiGe) to form the P+S/D non-insulative regions 150 and 152. The SiN film is then removed, and the intermediate structure at this stage may be cleaned.

As illustrated in FIG. 2R, silicide layers 156, 160, 164, and 168 are formed on the S/D non-insulative regions 146, 148, 150, and 152, respectively. ILD oxide 190 is then deposited, and the surface of the ILD oxide 190 is flattened, using any of various suitable processes, such as CMP.

As illustrated in FIG. 2S, the dummy poly regions 274 and 276 are removed forming gate trenches for the NMOS and PMOS devices 123 and 125. HK dielectric regions 104 and 108, Nmet gate regions 112 and 116, and Pmet gate regions are then deposited in the gate trenches for the NMOS and PMOS devices, and the Pmet gate region is selectively removed from the NMOS device 123, leaving only the Pmet gate region 120 for the PMOS device 125. Contact regions 122 and 128 of any suitable electrically conductive material (e.g., W) are then deposited, and CMP may be performed on the upper surface of the intermediate structure at this stage.

As illustrated in FIG. 2T, ILD oxide region 194 is then deposited, and a PR and etching process is used to create trenches for the contacts 191, 192, 193, 195, 196, and 197, followed by the deposition of a contact liner and metal (e.g., titanium (Ti), titanium nitride (TiN), and tungsten (W)). Contact CMP is then performed, forming the contacts 191, 192, 193, 195, 196, and 197.

FIGS. 2U and 2V illustrate cross-sections of the semiconductor device 100 taken through the lines AA' and BB' shown in FIG. 2T, respectively, in accordance with certain aspects of the present disclosure. As illustrated, contact regions 290 and 292 are also formed for the back gate in a similar manner to forming the contacts 191, 192, 193, 195, 196, and 197, as described above with respect to FIG. 2T.

While the examples described herein have illustrated front and back gate regions implemented using HK/MG technology to facilitate understanding, N+(and/or P+) and n-well (NW) (and/or p-well (PW)) regions may be used instead. For example, NW/N+ and PW/P+ may be formed for the back gate in a silicon substrate, and an oxide layer may be used instead of an HK dielectric layer to form the back-gate oxide. The techniques described herein allow for the back-gate dielectric (e.g., the HK dielectric regions 102 and 106 for the back gate) to have the same thickness as the front-gate dielectric (e.g., the HK dielectric regions 104 and 108 for the front gate). Therefore, the same level of controllability of the channel may be available via the back gate as compared to the front gate.

Moreover, using a graphene layer transfer technique to grow the channel 206 allows the channel to be about twice as thick as a channel of a typical FD-SOI device. The fabrication process described herein also follows a planar silicon-on-insulator (SOI) complementary metal-oxide semiconductor (CMOS) process to deposit/grow the front-gate dielectric and gate region and to pattern the gate and respective spacers adjacent to the gate regions. The epitaxial S/D regions may be implemented with twice the depth of S/D regions of a typical FD-SOI device, reducing the channel extension resistance and increasing the ability to drive current via the semiconductor device 100. Moreover, the planar double-gate NMOS and PMOS (e.g., CMOS) integration described herein allows for the front and back gates to be driven separately and biased using different bias voltages. For example, the front gate and back gate can be driven with different voltages to set the semiconductor device 100 in different operating modes for logic, radio-frequency (RF)/analog, and internet of things (IoT) applications.

Figure 3:
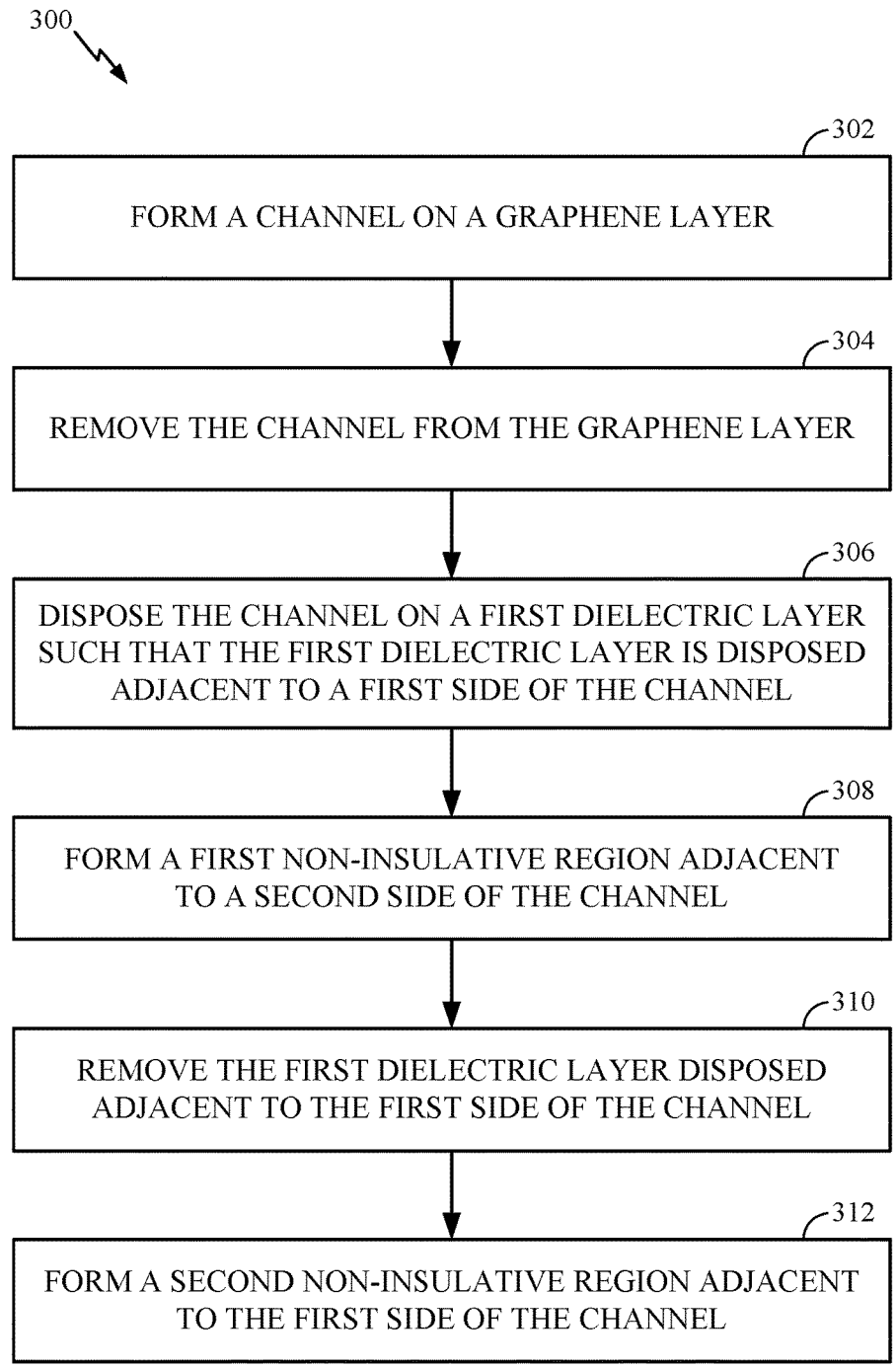
FIG. 3 is a flow diagram of example operations for fabricating a semiconductor device, in accordance with certain aspects of the present disclosure.

FIG. 3 is a flow diagram of example operations 300 for fabricating the semiconductor device 100, in accordance with certain aspects of the present disclosure. The operations 300 may be performed, for example, by a semiconductor processing chamber.

The operations 300 begin, at block 302, by forming a channel (e.g., channel 206) on a graphene layer (e.g., graphene layer 204), and at block 304, removing the channel from the graphene layer. At block 306, the channel is deposited on a first dielectric layer (e.g., oxide layer 214) such that the first dielectric layer is disposed adjacent to a first side of the channel, and at block 308, a first non-insulative region (e.g., the Nmet gate region 114) is formed adjacent to a second side of the channel. At block 310, the operations 300 continue by removing the first dielectric layer disposed adjacent to the first side of the channel, and at block 312, forming a second non-insulative region (e.g., the Nmet gate region 112) adjacent to the first side of the channel.

In certain aspects, the operations 300 also include forming a second dielectric layer (e.g., the HK dielectric region 102) adjacent to the second side of the channel, prior to forming the first non-insulative region, such that the second dielectric layer is between the first non-insulative region and the channel. In certain aspects, the operations 300 also include forming a second dielectric layer (e.g., the HK dielectric region 104) adjacent to the first side of the channel prior to forming the second non-insulative region, such that the second dielectric layer is between the second non-insulative region and the channel. In certain aspects, the second dielectric layer comprises a high-k metal layer and the second non-insulative region comprises a metal region. In certain aspects, the first side and the second side are on opposite sides of the channel.

In certain aspects, the first dielectric layer is formed on a surface of a wafer (e.g., handle wafer 212) after surface oxide hydrophilic pretreatment of the wafer. In this case, the operations 300 also include decoupling the wafer from the first dielectric layer prior to the removing of the first dielectric layer.

In certain aspects, the operations 300 also include forming a third non-insulative region (e.g., lightly doped region 130) in the channel and forming a fourth non-insulative region (e.g., non-insulative region 146) adjacent to the third non-insulative region. In this case, the third non-insulative region has a lower doping concentration than the fourth non-insulative region.

In certain aspects, the operations 300 also include forming a fifth non-insulative region (e.g., lightly doped region 132) in the channel, after removing the first dielectric layer, such that a portion of the channel is disposed between the fifth non-insulative region and the third non-insulative region.

In certain aspects, the operations 300 also include forming a sixth non-insulative region (e.g., lightly doped region 134) in the channel, and forming a seventh non-insulative region (e.g., non-insulative region 148) adjacent to the sixth non-insulative region. The sixth non-insulative region may have a lower doping concentration than the seventh non-insulative region. In this case, the operations may also include forming an eighth non-insulative region (e.g., lightly doped region 136) in the channel, after removing the first dielectric layer, such that another portion of the channel is disposed between the eighth non-insulative region and the sixth non-insulative region. In certain aspects, the fourth non-insulative region is formed adjacent to a first lateral side of the channel and the seventh non-insulative region is formed adjacent to a second lateral side of the channel.

In certain aspects, the operations 300 also include forming a first silicide layer (e.g., silicide layer 154) adjacent to a bottom side of the fourth non-insulative region, and forming a second silicide layer (e.g., silicide layer 156) adjacent to a top side of the fourth non-insulative region after the removing of the first dielectric layer.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A semiconductor device, comprising:
   a substrate;
   a channel disposed above the substrate;
   a first dielectric layer disposed adjacent to a first side of the channel;
   a first non-insulative region disposed below the first dielectric layer;
   a second dielectric layer disposed adjacent to a second side of the channel;
   a second non-insulative region disposed above the second dielectric layer;
   a third non-insulative region disposed adjacent to a third side of the channel;
   a first silicide layer disposed above the third non-insulative region; and
   a second silicide layer disposed below the third non-insulative region.

2. The semiconductor device of claim 1, wherein the first non-insulative region is electrically isolated from the second non-insulative region.

3. The semiconductor device of claim 1, further comprising:
a fourth non-insulative region disposed adjacent to a fourth side of the channel.

4. The semiconductor device of claim 1, wherein at least one of the first non-insulative region or the second non-insulative region comprises a metal gate region.

5. The semiconductor device of claim 3, wherein the third non-insulative region comprises a drain of the semiconductor device and wherein the fourth non-insulative region comprises a source of the semiconductor device.

6. The semiconductor device of claim 3, wherein the first side comprises a bottom side of the channel, wherein the second side comprises a top side of the channel, and wherein the third side and the fourth side comprise different lateral surfaces of the channel.

7. The semiconductor device of claim 3, further comprising a fifth non-insulative region and a sixth non-insulative region, disposed adjacent to the fourth non-insulative region and having a lower doping concentration than the fourth non-insulative region, wherein a portion of the channel is disposed between the fifth non-insulative region and the sixth non-insulative region.

8. A semiconductor device, comprising:
a substrate;
a channel disposed above the substrate;
a first dielectric layer disposed adjacent to a first side of the channel;
a first non-insulative region disposed below the first dielectric layer;
a second dielectric layer disposed adjacent to a second side of the channel;
a second non-insulative region disposed above the second dielectric layer;
a third non-insulative region disposed adjacent to a third side of the channel; and
a fourth non-insulative region and a fifth non-insulative region, the fourth non-insulative region and the fifth non-insulating region being disposed adjacent to the third non-insulative region and having a lower doping concentration than the third non-insulative region, wherein a portion of the channel is disposed between the fourth non-insulative region and the fifth non-insulative region.

9. The semiconductor device of claim 8, wherein the first non-insulative region is electrically isolated from the second non-insulative region.

10. The semiconductor device of claim 8, further comprising a sixth non-insulative region disposed adjacent to a fourth side of the channel.

11. The semiconductor device of claim 8, further comprising:
a first silicide layer disposed above the third non-insulative region; and
a second silicide layer disposed below the third non-insulative region.

12. The semiconductor device of claim 8, wherein at least one of the first non-insulative region or the second non-insulative region comprises a metal gate region.

13. The semiconductor device of claim 10, wherein the third non-insulative region comprises a drain of the semiconductor device and wherein the sixth non-insulative region comprises a source of the semiconductor device.

14. The semiconductor device of claim 10, wherein the first side comprises a bottom side of the channel, wherein the second side comprises a top side of the channel, and wherein the third side and the fourth side comprise different lateral surfaces of the channel.

15. The semiconductor device of claim 10, further comprising a seventh non-insulative region and an eighth non-insulative region, disposed adjacent to the sixth non-insulative region and having a lower doping concentration than the sixth non-insulative region, wherein another portion of the channel is disposed between the seventh non-insulative region and the eighth non-insulative region.

16. The semiconductor device of claim 10, further comprising:
a first silicide layer disposed above the sixth non-insulative region; and
a second silicide layer disposed below the sixth non-insulative region.

17. A method for fabricating a semiconductor device, comprising:
forming a channel on a graphene layer;
removing the channel from the graphene layer;
disposing the channel on a first dielectric layer such that the first dielectric layer is disposed adjacent to a first side of the channel;
forming a first non-insulative region adjacent to a second side of the channel;
removing the first dielectric layer disposed adjacent to the first side of the channel; and
forming a second non-insulative region adjacent to the first side of the channel.

18. The method of claim 17, further comprising forming a second dielectric layer adjacent to the second side of the channel, prior to forming the first non-insulative region, such that the second dielectric layer is between the first non-insulative region and the channel.

19. The method of claim 17, further comprising forming a second dielectric layer adjacent to the first side of the channel prior to forming the second non-insulative region, such that the second dielectric layer is between the second non-insulative region and the channel.

20. The method of claim 17, wherein the first side and the second side are on opposite sides of the channel.

21. The method of claim 17, wherein the first dielectric layer is formed on a surface of a wafer after surface oxide hydrophilic pretreatment of the wafer, the method further comprising decoupling the wafer from the first dielectric layer prior to the removing of the first dielectric layer.

22. The method of claim 17, further comprising:
forming a third non-insulative region in the channel; and
forming a fourth non-insulative region adjacent to the third non-insulative region, wherein the third non-insulative region has a lower doping concentration than the fourth non-insulative region.

23. The method of claim 22, further comprising:
forming a fifth non-insulative region in the channel, after removing the first dielectric layer, such that a portion of the channel is disposed between the fifth non-insulative region and the third non-insulative region.

24. The method of claim 22, further comprising:
forming a first silicide layer adjacent to a bottom side of the fourth non-insulative region; and
forming a second silicide layer adjacent to a top side of the fourth non-insulative region after the removing of the first dielectric layer.

25. The method of claim 19, wherein the second dielectric layer comprises a high-k layer and the second non-insulative region comprises a metal gate region.

26. The method of claim 23, further comprising:
forming a sixth non-insulative region in the channel; and
forming a seventh non-insulative region adjacent to the sixth non-insulative region, wherein the sixth non-insulative region has a lower doping concentration than the seventh non-insulative region.

27. The method of claim 26, further comprising:
forming an eighth non-insulative region in the channel, after removing the first dielectric layer, such that another portion of the channel is disposed between the eighth non-insulative region and the sixth non-insulative region.

28. The method of claim 27, wherein the fourth non-insulative region is formed adjacent to a first lateral side of the channel and the seventh non-insulative region is formed adjacent to a second lateral side of the channel.

\* \* \* \* \*